United States Patent
Faibish et al.

(10) Patent No.: US 10,733,158 B1
(45) Date of Patent: Aug. 4, 2020

(54) SYSTEM AND METHOD FOR HASH-BASED ENTROPY CALCULATION

(71) Applicant: EMC IP Holding Company, LLC, Hopkinton, MA (US)

(72) Inventors: Sorin Faibish, Newton, MA (US); Philip Shilane, Newtown, PA (US); Ivan Basov, Brookline, MA (US); Istvan Gonczi, Berkley, MA (US); Philippe Armangau, Acton, MA (US); Vamsi Vankamamidi, Hopkinton, MA (US)

(73) Assignee: EMC IP Holding Company LLC, Hopkinton, MA (US)

( * ) Notice: Subject to any disclaimer, the term of this patent is extended or adjusted under 35 U.S.C. 154(b) by 0 days.

(21) Appl. No.: 16/403,026

(22) Filed: May 3, 2019

(51) Int. Cl.
*G06F 16/00* (2019.01)
*G06F 16/215* (2019.01)
*H03M 7/30* (2006.01)
*G06F 16/22* (2019.01)

(52) U.S. Cl.
CPC ........ *G06F 16/215* (2019.01); *G06F 16/2255* (2019.01); *H03M 7/3091* (2013.01)

(58) Field of Classification Search
CPC combination set(s) only.
See application file for complete search history.

(56) References Cited

U.S. PATENT DOCUMENTS

| | | | |
|---|---|---|---|
| 8,117,173 B2 | 2/2012 | Gurevich et al. | |
| 8,572,053 B2* | 10/2013 | Tofano | G06F 16/2272 707/692 |
| 8,751,462 B2 | 6/2014 | Huang et al. | |
| 8,849,772 B1 | 9/2014 | Huang et al. | |
| 8,909,630 B1* | 12/2014 | Seth | G06F 16/9537 707/724 |
| 8,914,338 B1 | 12/2014 | Wallace et al. | |
| 9,626,249 B1 | 4/2017 | Bushman et al. | |
| 9,773,118 B1 | 9/2017 | Bennett et al. | |
| 10,135,462 B1 | 11/2018 | Wallace et al. | |
| 10,244,234 B2* | 3/2019 | Kennedy | H04N 19/115 |
| 2008/0154928 A1* | 6/2008 | Bashyam | H03M 7/30 |
| 2010/0142811 A1* | 6/2010 | Okamoto | H04N 1/41 382/166 |
| 2011/0099351 A1* | 4/2011 | Condict | G06F 3/0608 711/216 |
| 2011/0099635 A1 | 4/2011 | Silberman et al. | |
| 2011/0219451 A1* | 9/2011 | McDougal | G06F 21/562 726/23 |
| 2012/0297464 A1 | 11/2012 | Busch et al. | |

(Continued)

OTHER PUBLICATIONS

Shilane et al., "WAN-Optimized Replication of Backup Datasets Using Stream-Informed Delta Compression"; Backup Recovery Systems Division, EMC Coporation, ACM Transactions on Storage, vol. 8, No. 4, Article 13, Publication date: Nov. 2012.

(Continued)

*Primary Examiner* — Noosha Arjomandi
(74) *Attorney, Agent, or Firm* — Brian J. Colandreo; Mark H. Whittenberger; Holland & Knight LLP

(57) ABSTRACT

A method, computer program product, and computing system for receiving a candidate data portion; calculating a distance-preserving hash for the candidate data portion; and performing an entropy analysis on the distance-preserving hash to generate a hash entropy for the candidate data portion.

16 Claims, 9 Drawing Sheets

(56) References Cited

U.S. PATENT DOCUMENTS

| | | | |
|---|---|---|---|
| 2012/0311345 A1 | 12/2012 | Dhuse et al. | |
| 2013/0179408 A1* | 7/2013 | Stoakes | G06F 3/0608 707/692 |
| 2013/0198152 A1 | 8/2013 | McGhee et al. | |
| 2014/0237202 A1* | 8/2014 | Yamamoto | G06F 3/0641 711/162 |
| 2014/0244604 A1 | 8/2014 | Oltean et al. | |
| 2015/0006475 A1 | 1/2015 | Guo et al. | |
| 2015/0088945 A1 | 3/2015 | Kruus et al. | |
| 2015/0142755 A1* | 5/2015 | Kishi | G06F 12/04 707/692 |
| 2016/0042491 A1 | 2/2016 | Croxford et al. | |
| 2016/0077924 A1* | 3/2016 | Todd | G06F 12/04 707/692 |
| 2016/0085751 A1* | 3/2016 | Camble | G06F 11/1453 707/679 |
| 2016/0110260 A1* | 4/2016 | Chandrasekharan | G06F 11/1453 707/652 |
| 2016/0170657 A1* | 6/2016 | Suehr | G06F 3/0649 711/162 |
| 2016/0328154 A1 | 11/2016 | Mizushima et al. | |
| 2017/0150145 A1* | 5/2017 | Kennedy | H04N 19/115 |
| 2017/0161202 A1 | 6/2017 | Erez et al. | |
| 2017/0242744 A1* | 8/2017 | Wang | G06F 11/0727 |
| 2017/0364698 A1* | 12/2017 | Goldfarb | G06F 21/6218 |
| 2017/0366353 A1* | 12/2017 | Struttmann | G06F 21/64 |
| 2018/0205552 A1* | 7/2018 | Struttmann | H04L 9/3239 |
| 2018/0285014 A1 | 10/2018 | Li et al. | |
| 2019/0007433 A1 | 1/2019 | McLane | |
| 2019/0026303 A1 | 1/2019 | Guerra Delgado et al. | |
| 2019/0065152 A1* | 2/2019 | Jaroch | G06F 7/588 |
| 2019/0065519 A1* | 2/2019 | Ohtsuji | G06F 16/1748 |
| 2019/0121673 A1* | 4/2019 | Gold | G06T 1/20 |

OTHER PUBLICATIONS

Shilane et al., "Delta Compressed and Deduplicated Storage Using Stream-Informed Locality", USENIX Workshop on Hot Topics in Storage (HotStorage), 2012.

Ebeling et al., "Entropy and Compressibility of Symbol Sequences" PhysComp96, Feb. 23, 1997; Institute of Physics, Humboldt University.

Balakrishnan et al., "Relationship Between Entropy and Test Data Compression", IEEE Transacations on Computer-Aided Design of Integrated Circuits and Systems, vol. 26, No. 2, Feb. 2007.

Wikipedia, "Entropy (Information Theory)", retrieved Oct. 9, 2019, [https://en.wikipedia.org/wiki/Entropy_(information_theory)].

ForensicKB, "File Entropy explained", retrieved Oct. 9, 2019. [http://www.forensickb.com/2013/03/file-entropy-explained.html].

Breitinger et al., "Similarity Hasing Based on Levenshtein Distances", 10th IFIP International Conference on Digital Forensics, Jan. 2014.

Non-Final Office Action issued in U.S. Appl. No. 16/402,966 dated Jul. 11, 2019.

Non-Final Office Action issued in U.S. Appl. No. 16/403,147 dated Aug. 2, 2019.

Non-Final Office Action issued in U.S. Appl. No. 16/403,078 dated Aug. 6, 2019.

First Action Interview Pilot Program Pre-Interview Communication issued in U.S. Appl. No. 16/403,218 dated Jul. 30, 2019.

Preston, "What is data deduplication, and how is it implemented?", Network World, pp. 2-6, 2018.

Non-Final Office Action issued in counterpart U.S. Appl. No. 16/403,218 dated Oct. 21, 2019.

Final Office Action issued in U.S. Appl. No. 16/402,966 dated Jan. 22, 2020.

Final Office Action issued in U.S. Appl. No. 16/403,147 dated Feb. 6, 2020.

Final Office Action issued in U.S. Appl. No. 16/403,218 dated Feb. 5, 2020.

Final Office Action issued in U.S. Appl. No. 16/403,078 dated Feb. 5, 2020.

Non-Final Office Action issued in related U.S. Appl. No. 16/402,966 dated May 13, 2020.

Notice of Allowance issued in related U.S. Appl. No. 16/403,078 dated Jun. 11, 2020.

Non-Final Office Action issued in related U.S. Appl. No. 16/403,218 dated Oct. 21, 2019.

Notice of Allowance issued in related U.S. Appl. No. 16/403,026 dated Nov. 12, 2019.

Final Office Action issued in related U.S. Appl. No. 16/402,966 dated Jan. 22, 2020.

Final Office Action issued in related U.S. Appl. No. 16/403,147 dated Feb. 6, 2020.

Final Office Action issued in related U.S. Appl. No. 16/403,218 dated Feb. 5, 2020.

Notice of Allowance issued in reiated U.S. Appl. No. 16/403,625 dated Mar. 18, 2020.

\* cited by examiner

SYSTEM AND METHOD FOR HASH-BASED ENTROPY CALCULATION

TECHNICAL FIELD

This disclosure relates to storage management processes and, more particularly, to storage management processes that maximize storage efficiency.

BACKGROUND

Storing and safeguarding electronic content is of paramount importance in modern business. Accordingly, various methodologies may be employed to protect and distribute such electronic content, wherein the storage systems that process such content may strive to do so in as an efficient manner as possible. Unfortunately, and due to inherent limitations in some of the technology utilized in such storage systems, complex methodologies may need to be utilized in order to navigate around such inherent shortcomings. For example, as memory technology advances, the speed of such memory technology is vastly increasing . . . as is the price of such memory technology. Accordingly, systems and methods (e.g., such as deduplication and compression) may be employed that enhance efficiency concerning the use of such memory systems.

SUMMARY OF DISCLOSURE

In one implementation, a computer-implemented method is executed on a computing device and includes: receiving a candidate data portion; calculating a di stance-preserving hash for the candidate data portion; and performing an entropy analysis on the distance-preserving hash to generate a hash entropy for the candidate data portion.

One or more of the following features may be included. The hash entropy for the candidate data portion may be compared to a predefined hash entropy threshold. If the hash entropy for the candidate data portion adheres to the predefined hash entropy threshold, the candidate data portion may be compressed. If the hash entropy for the candidate data portion exceeds the predefined hash entropy threshold, the hash entropy for the candidate data portion may be compared to one or more target data portion hash entropies to identify one or more potential target data portions. A comparison analysis may be compared on the one or more potential target data portions, with respect to the candidate data portion, to identify an acceptable target data portion. A deduplication operation of the candidate data portion may be performed based upon the acceptable target data portion. The predefined hash entropy threshold may be configured such that: a data compression operation will yield a more efficient result than a deduplication operation when the candidate data portion has a hash entropy that adheres to the hash entropy threshold; and a deduplication operation will yield a more efficient result than a data compression operation when the candidate data portion has a hash entropy above the hash entropy threshold.

In another implementation, a computer program product resides on a computer readable medium and has a plurality of instructions stored on it. When executed by a processor, the instructions cause the processor to perform operations including receiving a candidate data portion; calculating a distance-preserving hash for the candidate data portion; and performing an entropy analysis on the distance-preserving hash to generate a hash entropy for the candidate data portion.

One or more of the following features may be included. The hash entropy for the candidate data portion may be compared to a predefined hash entropy threshold. If the hash entropy for the candidate data portion adheres to the predefined hash entropy threshold, the candidate data portion may be compressed. If the hash entropy for the candidate data portion exceeds the predefined hash entropy threshold, the hash entropy for the candidate data portion may be compared to one or more target data portion hash entropies to identify one or more potential target data portions. A comparison analysis may be compared on the one or more potential target data portions, with respect to the candidate data portion, to identify an acceptable target data portion. A deduplication operation of the candidate data portion may be performed based upon the acceptable target data portion. The predefined hash entropy threshold may be configured such that: a data compression operation will yield a more efficient result than a deduplication operation when the candidate data portion has a hash entropy that adheres to the hash entropy threshold; and a deduplication operation will yield a more efficient result than a data compression operation when the candidate data portion has a hash entropy above the hash entropy threshold.

In another implementation, a computing system includes a processor and memory is configured to perform operations including receiving a candidate data portion; calculating a distance-preserving hash for the candidate data portion; and performing an entropy analysis on the distance-preserving hash to generate a hash entropy for the candidate data portion.

One or more of the following features may be included. The hash entropy for the candidate data portion may, be compared to a predefined hash entropy threshold. If the hash entropy for the candidate data portion adheres to the predefined hash entropy threshold, the candidate data portion may be compressed. If the hash entropy for the candidate data portion exceeds the predefined hash entropy threshold, the hash entropy for the candidate data portion may be compared to one or more target data portion hash entropies to identify one or more potential target data portions. A comparison analysis may be compared on the one or more potential target data portions, with respect to the candidate data portion, to identify an acceptable target data portion. A deduplication operation of the candidate data portion may be performed based upon the acceptable target data portion. The predefined hash entropy threshold may be configured such that: a data compression operation will yield a more efficient result than a deduplication operation when the candidate data portion has a hash entropy that adheres to the hash entropy threshold; and a deduplication operation will yield a more efficient result than a data compression operation when the candidate data portion has a hash entropy above the hash entropy threshold.

The details of one or more implementations are set forth in the accompanying drawings and the description below, Other features and advantages will become apparent from the description, the drawings, and the claims.

BRIEF DESCRIPTION OF THE DRAWINGS

Like reference symbols in the various drawings indicate like elements.

DETAILED DESCRIPTION OF THE PREFERRED EMBODIMENTS

Figure 1:
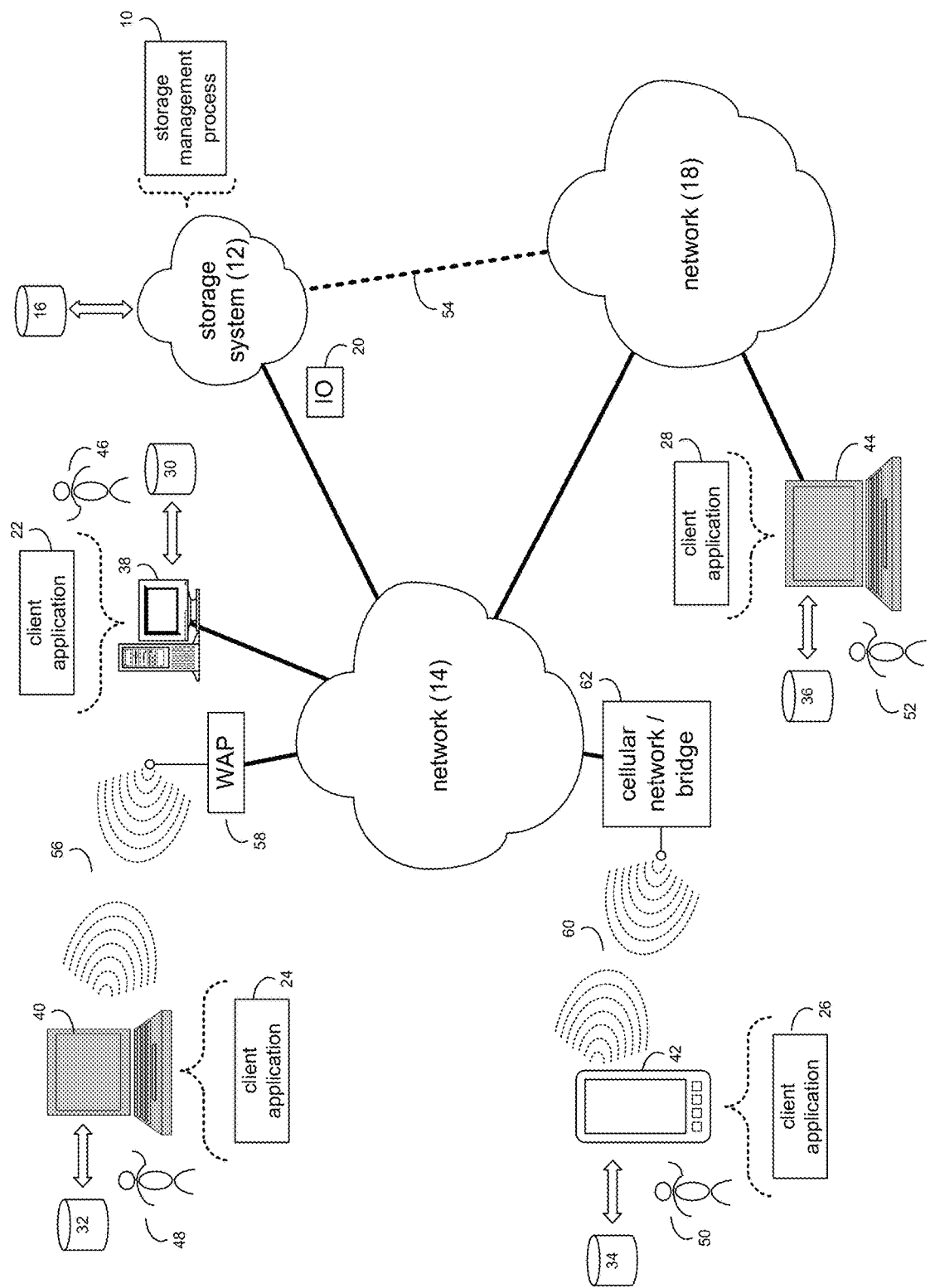
FIG. 1 is a diagrammatic view of a storage system and a storage management process coupled to a distributed computing network.

System Overview:

Referring to FIG. 1, there is shown storage management process 10 that may reside on and may be executed by storage system 12, which may be connected to network 14 (e.g., the Internet or a local area network). Examples of storage system 12 may include, but are not limited to: a personal computer with a memory system, a server computer with a memory system, a Network Attached Storage (NAS) system, a Storage Area Network (SAN) and a cloud-based device with a memory system.

As is known in the art, a SAN may include one or more of a personal computer, a server computer, a series of server computers, a mini computer, a mainframe computer, a RAID device and a NAS system. The various components of storage system 12 may execute one or more operating systems, examples of which may include but are not limited to: Microsoft Windows Server™; Redhat Linux™, Unix, or a custom operating system, for example.

The instruction sets and subroutines of storage management process 10, which may be stored on storage device 16 coupled to storage system 12, may be executed by one or more processors (not shown) and one or more memory architectures (not shown) included within storage system 12, Storage device 16 may include but is not limited to: a hard disk drive; an optical drive; a RAID device; a random access memory (RAM); a read-only memory (ROM); and all forms of flash memory storage devices.

Network 14 may be connected to one or more secondary networks (e.g., network 18), examples of which may include but are not limited to: a local area network; a wide area network; or an intranet, for example.

Various IO requests (e.g. IO request 20) may be sent from client applications 22, 24, 26, 28 to storage system 12. Examples of IO request 20 may include but are not limited to data write requests (i.e. a request that content be written to storage system 12) and data read requests (i.e. a request that content be read from storage system 12).

The instruction sets and subroutines of client applications 22, 24, 26, 28, which may be stored on storage devices 30, 32, 34, 36 (respectively) coupled to client electronic devices 38, 40, 42, 44 (respectively), may be executed by one or more processors (not shown) and one or more memory architectures (not shown) incorporated into client electronic devices 38, 40, 42, 44 (respectively). Storage devices 30, 32, 34, 36 may include but are not limited to: hard disk drives; optical drives; RAID devices; random access memories (RAM); read-only memories (ROM), and all forms of flash memory storage devices. Examples of client electronic devices 38, 40; 42, 44 may include, but are not limited to, personal computer 38, laptop computer 40, smartphone 42, notebook computer 44, a server (not shown), a data-enabled, cellular telephone (not shown), and a dedicated network device (not shown).

Users 46, 48, 50, 52 may access storage system 12 directly through network 14 or through secondary network 18. Further, storage system 12 may be connected to network 14 through secondary network 18, as illustrated with link line 54.

The various client electronic devices (e.g., client electronic devices 38, 40, 42, 44) may be directly or indirectly coupled to network 14 (or network 18). For example; personal computer 38 is shown directly coupled to network 14 via a hardwired network connection. Further, notebook computer 44 is shown directly coupled to network 18 via a hardwired network connection. Laptop computer 40 is shown wirelessly coupled to network 14 via wireless communication channel 56 established between laptop computer 40 and wireless access point (i.e., WAP) 58, which is shown directly coupled to network 14. WAP 58 may be, for example, an IEEE 802.11a, 802.11b, 802.11g, 802.11n, Wi-Fi; and/or Bluetooth device that is capable of establishing wireless communication channel 56 between laptop computer 40 and WAP 58. Smartphone 42 is shown wirelessly coupled to network 14 via wireless communication channel 60 established between smartphone 42 and cellular network/bridge 62, which is shown directly coupled to network 14.

Client electronic devices 38, 40, 42, 44 may each execute an operating system, examples of which may include but are not limited to Microsoft Windows™, Apple Macintosh™, Redhat Linux™, or a custom operating system.

Figure 2:
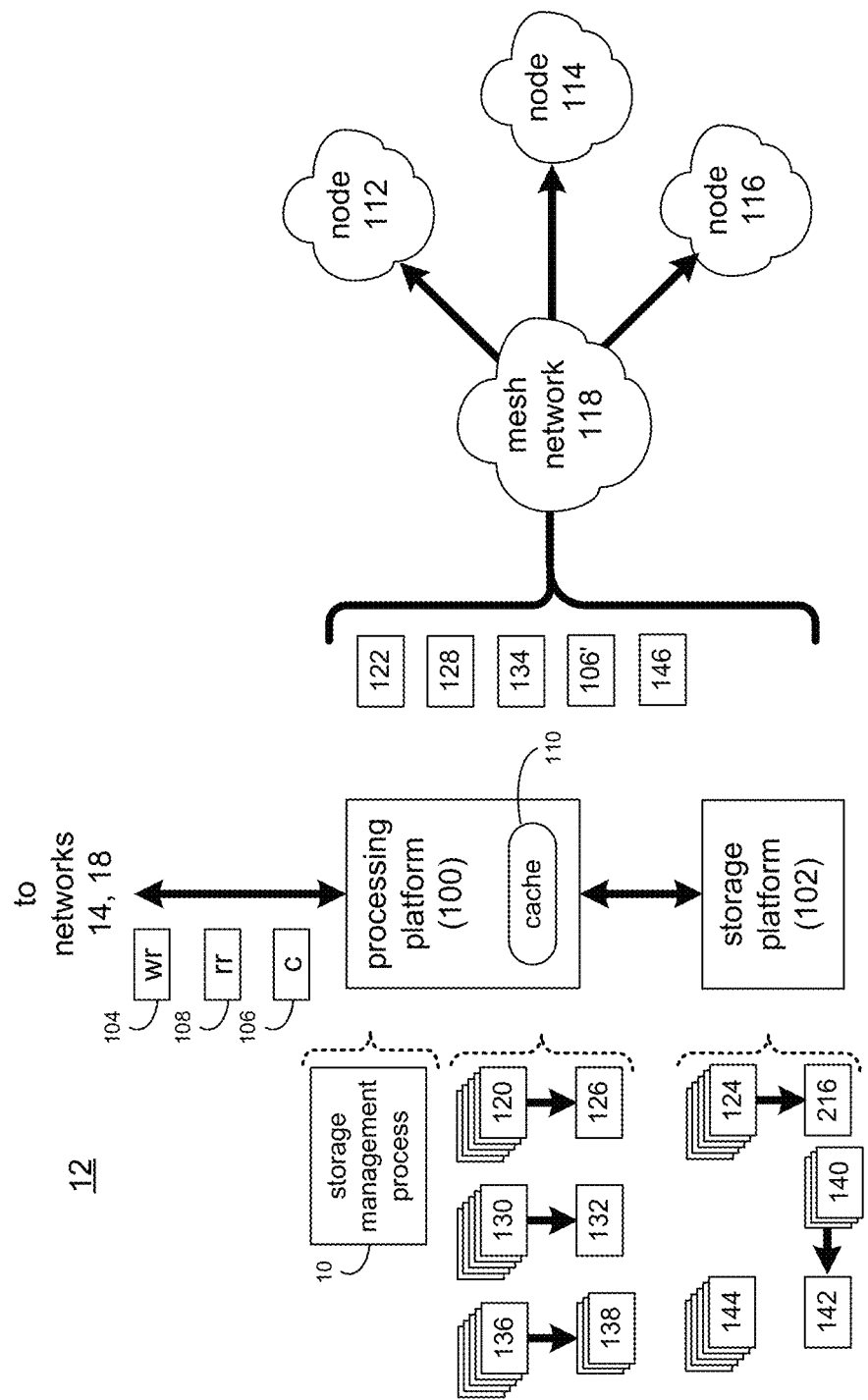
FIG. 2 is a diagrammatic view of the storage system of FIG. 1.

The Data Storage System:

Referring also to FIG. 2, there is shown a general implementation of storage system 12. In this general implementation, storage system 12 may include processing platform 100, wherein processing platform 100 may be configured to perform computational tasks and may be configured to store data within storage platform 102.

Depending on the manner in which storage system 12 is configured, storage platform 102 may include a single storage device (such as a single hard disk drive or a single solid state storage device) or may include a plurality of storage devices that are configured to provide various levels of performance and/or high availability. For example, if storage platform 102 includes a plurality of storage devices (e.g.; hard disk drives and/or solid state storage devices), this plurality of storage devices may be configured to form a RAID array utilizing various standard RAID structures (e.g., RAID 0, RAID 1, RAID 3; RAID 5, RAID 6; RAID 7 or RAID 10); thus providing a higher level of performance and/or availability.

Storage system 12 may be configured to execute all or a portion of storage management process 10. The instruction sets and subroutines of storage management process 10, which may be stored on a storage device (e.g., storage device 16) coupled to processing platform 100, may be executed by one or more processors (not shown) and one or more memory architectures (not shown) included within processing platform 100. Storage device 16 may include but is not limited to: a hard disk drive; a RAID device; a random access memory (RAM); a read-only memory (ROM); and all forms of flash memory storage devices.

As discussed above, various IO requests (e.g. IO request 20) may be generated. For example; these IO requests may be sent from client applications 22, 24, 26, 28 to storage system 12. Additionally/alternatively and when storage system 12 is configured as an application server, these IO requests may be internally generated within storage system 12. Examples of IO request 20 may include but are not limited to data write request 104 (i.e. a request that content 106 be written to storage system 12) and data read request 108 (i.e. a request that content 106 be read from storage system 12).

During operation of processing platform 100, content 106 to be written to storage system 12 may be processed by processing platform 100. Additionally/alternatively and when storage system 12 is configured as an application server, content 106 to be written to storage system 12 may be internally generated by processing platform 100.

Processing platform 100 may include cache memory system 110. Examples of cache memory system 110 may include but are not limited to a volatile, solid-state, cache memory system (e.g., a dynamic RAM cache memory system) and/or a non-volatile, solid-state, cache memory system (e.g., a flash-based, cache memory system). Processing platform 100 may initially store content 106 within cache memory system 110. Depending upon the manner in which cache memory system 110 is configured, processing platform 100 may immediately write content 106 to storage platform 102 (if cache memory system 110 is configured as a write-through cache) or may subsequently write content 106 to storage platform 102 (if cache memory system 110 is configured as a write-back cache).

Storage system 12 may be configured to include a plurality of processing platforms and/or storage platforms (wherein a processing platform and a storage platform may collectively constitute a node). For example and in addition to processing platform 100/storage platform 102, storage system 12 may include (in this example) three additional nodes (e.g., nodes 112, 114, 116), each of which (as discussed above) may include a processing platform and a storage platform (not shown), wherein each of these nodes (e.g., nodes 112, 114, 116) may be coupled via a mesh network (e.g., mesh network 118).

As discussed above, storage platform 102 may include a plurality of storage devices (e.g., hard disk drives and/or solid state storage devices), wherein this plurality of storage devices may be configured to form a RAID array utilizing various standard RAID structures (e.g., RAID 0, RAID 1, RAID 3, RAID 5, RAID 6, RAID 7 or RAID 10), thus providing a higher level of performance and/or availability.

The cost per storage unit (e.g. gigabyte or terabyte) of storage platform 102 may vary greatly depending on the specific technology utilized within storage platform 102. For example, rotating electromechanical media (e.g., hard disk drives) may be comparatively inexpensive concerning their cost per storage unit. However, solid-state storage devices (e.g., flash memory storage devices) tend to be considerably more expensive per storage unit than rotating electromechanical media. Therefore, various technology and methodologies may be utilized to maximize the efficiency of such costlier storage technology. Examples of such technology may include but are not limited to data compression technology and data deduplication technology.

As is known in the art, data compression is a technique for reducing the number of bits needed to represent data within a storage device. Compressing data may save storage capacity, may speed up file transfers, and may decrease the cost of storage hardware and network bandwidth. Compression may be performed via an algorithm that determines how to shrink the size of the data. For instance, the algorithm may represent a larger string of bits with a smaller string of bits and may define a dictionary that maps out the conversion between the strings of bits.

As is known in the art, data deduplication is a technique for eliminating duplicate copies of repeating data. This technique is used to improve storage utilization and can also be applied to network data transfers to reduce the number of bytes that must be sent. In the deduplication process, unique chunks of data, or byte patterns, may be identified and stored during a process of analysis. As the analysis continues, other chunks are compared to the stored copy and whenever a match occurs, the redundant chunk is replaced with a small reference that points to the stored chunk. Given that the same byte pattern may occur dozens, hundreds, or even thousands of times, the amount of data that must be stored or transferred can be greatly reduced.

Figures 3A, 3B:
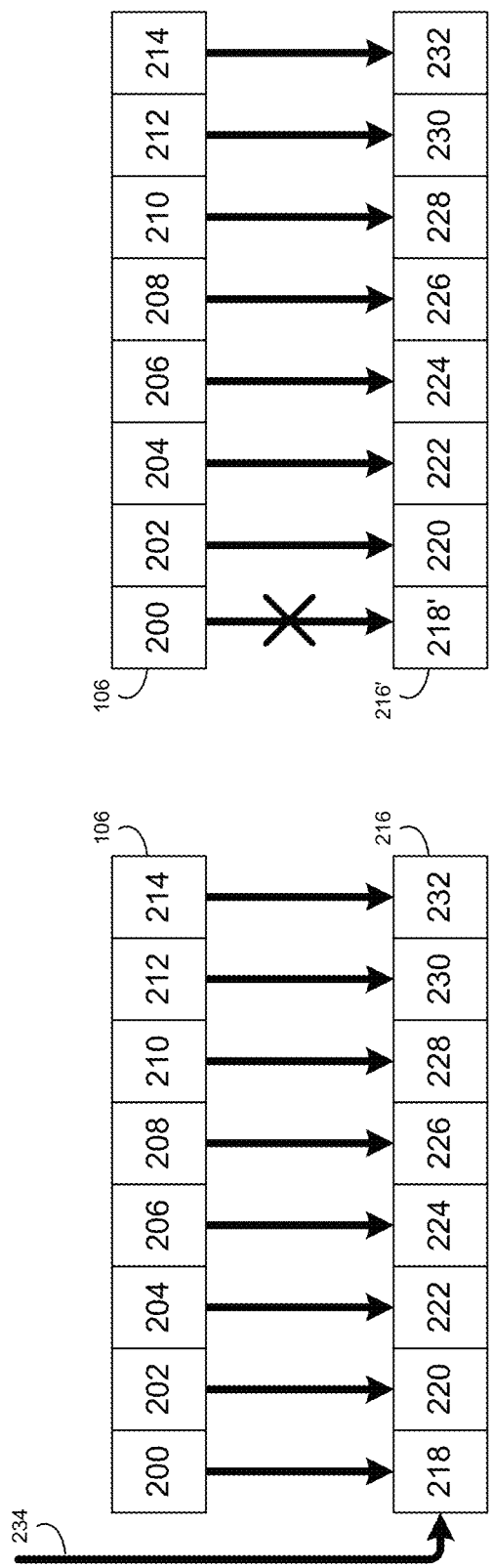
FIGS. 3A-3B are diagrammatic views of various blocks and sectors.

Referring also to FIGS. 3A-3B and with respect to deduplication, such deduplication may occur either as full deduplication or as partial deduplication.

An example of such a full deduplication operation is illustrated in FIG. 3A, wherein a deduplication candidate (e.g., content 106) may be a four kilobyte (4,096 byte) block that includes eight 512 byte sectors (e.g., sectors 200, 202, 204, 206, 208, 210, 212, 214). Assume that the deduplication candidate (e.g., content 106) is received by storage system 12 and, prior to writing the deduplication candidate (e.g., content 106) to storage platform 102, processing platform 100 may determine whether deduplication is possible. Accordingly, processing platform 100 may identify deduplication target 216, which may have been previously stored within storage platform 102 and may also include eight 512 byte sectors e.g.; sectors 218, 220, 222, 224, 226, 228, 230, 232).

While the deduplication candidate (e.g., content 106) and deduplication target 216 are shown to be four kilobyte (4,096 byte) blocks that include eight 512 byte sectors, this is for illustrative purposes only and is not intended to be a limitation of this disclosure, as other configurations are possible. For example, the deduplication candidate (e.g., content 106) and deduplication target 216 may be eight kilobyte (8,192 byte) blocks that include eight 1,024 byte sectors In order for full deduplication to be possible, each sector within the deduplication candidate (e.g., content 106) needs to be identical to the corresponding sector within deduplication target 216. Accordingly, sector 200 needs to be identical to sector 218; sector 202 needs to be identical to sector 220; sector 204 needs to be identical to sector 222; sector 206 needs to be identical to sector 224; sector 208 needs to be identical to sector 226; sector 210 needs to be identical to sector 228; sector 212 needs to be identical to sector 230; and sector 214 needs to be identical to sector 232.

Assuming that all of the eight sectors of the deduplication candidate (e.g., content 106) and deduplication target 216 are identical, full deduplication may occur. Specifically and being that the deduplication candidate (e.g., content 106) and deduplication target 216 are identical, the deduplication candidate (e.g., content 106) does not need to be stored on storage platform 102 and processing platform 100 may use a simple metadata pointer (e.g., pointer 234) to locate deduplication target 216 within storage platform 102. Therefore, in the event that the deduplication candidate (e.g., content 106) needs to be read, processing platform 100 may use pointer 234 (which may be maintained locally on processing platform 100) to retrieve deduplication target 216 from storage platform 102 so that it may be used to satisfy any read requests for the deduplication candidate (e.g., content 106).

An example of a partial deduplication operation is illustrated in FIG. 3B, wherein the deduplication candidate (e.g., content 106) may again be a four kilobyte (4,096 byte) block that includes eight 512 byte sectors (e.g., sectors 200, 202, 204, 206, 208, 210, 212, 214). Again, assume that the deduplication candidate (e.g., content 106) is received by storage system 12 and, prior to writing the deduplication candidate (e.g., content 106) to storage platform 102, processing platform 100 may determine whether deduplication is possible. Accordingly, processing platform 100 may again identify deduplication target 216', which may have been previously stored within storage platform 102 and may also include eight 512 byte sectors (e.g., sectors 218', 220, 222, 224, 226, 228, 230, 232).

Unlike full deduplication, partial deduplication may be possible even if each sector within the deduplication candidate (e.g., content 106) is not identical to the corresponding sector within deduplication target 216'. For this example, assume that sector 200 is not identical to sector 218' (e.g., due to minor edits being made to a header of a document). However, assume that sector 202 is identical to sector 220; sector 204 is identical to sector 222; sector 206 is identical to sector 224; sector 208 is identical to sector 226; sector 210 is identical to sector 228; sector 212 is identical to sector 230; and sector 214 is identical to sector 232.

Since (as discussed above) all eight sectors of the deduplication candidate (e.g., content 106) and deduplication target 216' are not identical, full deduplication is not possible. However, as seven of those eight sectors are identical, partial deduplication of the deduplication candidate (e.g., content 106) may occur. Specifically, the only portion of the deduplication candidate (e.g., content 106) that may need to be stored on storage platform 102 may be the one unique portion of content 106 (namely sector 200), wherein the remaining (and unsaved) portions of content 106 (namely sectors 202, 204, 206, 208, 210, 212, 214) may be obtained via the corresponding sectors of deduplication target 216' (namely sectors 218, 200, 222, 224, 226, 228, 230).

As will be discussed below in greater detail, storage management process 10 may be configured to utilize a comparison operation (e.g., an XOR operation) determine the level of similarity between a potential deduplication candidate and a related deduplication target.

Figure 4:
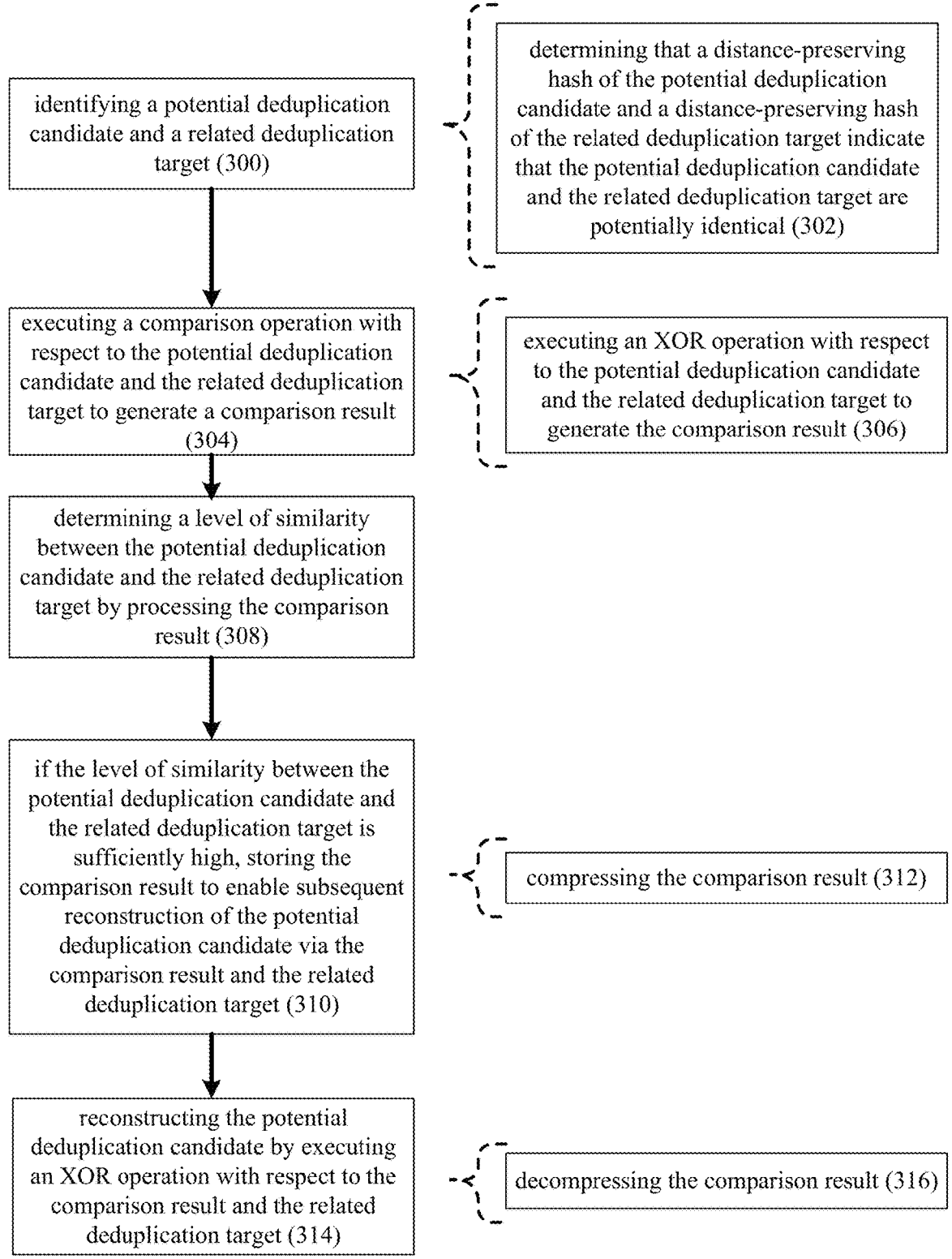
FIG. 4 is a flow chart of one embodiment of the storage management process of FIG. 1.

Referring also to FIG. 4, storage management process 10 may identify 300 a potential deduplication candidate (e.g., content 106) and a related deduplication target (e.g., deduplication target 216). Again, assume that the potential deduplication candidate (e.g., content 106) is received by storage system 12. Further, assume that storage management process 10 identifies 300 deduplication target 216, which may have been previously stored within storage platform 102 and includes eight 512 byte sectors (e.g., sectors 218, 220, 222, 224, 226, 228, 230, 232).

When identifying 300 a potential deduplication candidate e.g., content 106) and a related deduplication target (e.g., deduplication target 216), storage management process 10 may determine 302 that a distance-preserving hash of the potential deduplication candidate (e.g., content 106) and a distance-preserving hash of the related deduplication target (e.g., deduplication target 216) indicate that the potential deduplication candidate (e.g., content 106) and the related deduplication target (e.g., deduplication target 216) are potentially similar.

When content is being processed by storage system 12, a hash operation may be performed on all of the content received/generated to produce a mathematical representation of the content (e.g., in the form of stored hashes 120) before the content is stored within storage platform 102, wherein stored hashes 120 may be stored locally (e.g., on processing platform 100).

Accordingly, and whenever new content is received on processing platform 100, a hash of the new content received may be made (thus generating new hash 122) and new hash 122 may be compared to stored hashes 120 to determine whether there is a match. As stored hashes 120 are maintained locally (e.g., on processing platform 100), stored hashes 120 do not need to be retrieved from storage platform 102 prior to performing the comparison (thus enhancing comparison efficiency).

Accordingly, and whenever new content (e.g., content 106) is received/generated, storage system 12 may determine whether a deduplication procedure can be performed on this new content (e.g., content 106). Therefore, a hash of this new content (e.g., content 106) may be generated (resulting in new hash 122) and new hash 122 may be compared to each of stored hashes 120 to determine whether a match exists. If a match does exist, this match may indicate that this new content (e.g., content 106) is the same as (or similar to) content that was already stored within storage platform 102 (and is thus a candidate for a deduplication operation).

The above-described mathematical operations that produces stored hashes 120 and new hash 122 may be performed in slower and more accurate ways or in faster and less accurate ways. For example, cryptographic hashes tend to be more accurate but are computationally more expensive. Conversely, distance-preserving hashes tend to be less accurate but are computationally less expensive. One example of a distance-preserving hash may include but is not limited to a CRC (i.e., a cyclic redundancy check). Accordingly, while matching cryptographic hashes indicate that two pieces of content are identical, matching distance-preserving hashes only indicate that two pieces of content may be identical.

As discussed above and when identifying 300 a potential deduplication candidate (e.g., content 106) and a related deduplication target (e.g., deduplication target 216), storage management process 10 may determine 302 that a distance-preserving hash of the potential deduplication candidate (e.g., content 106) and a distance-preserving hash of the related deduplication target (e.g., deduplication target 216) indicate that the potential deduplication candidate (e.g., content 106) and a related deduplication target (e.g., deduplication target 216) are potentially identical.

Accordingly, assume that stored hashes 120 are distance-preserving hashes that were generated for content that was stored on storage platform 102 (e.g., stored content 124). And upon the potential deduplication candidate (e.g., content 106) being received by storage system 12, a distance-preserving hash (e.g., new hash 122) was generated and compared to each of stored hashes 120. Assume that new hash 122 matches hash 126 (included within stored hashes 120). Further, assume that hash 126 is a mathematical representation of the related deduplication target (e.g., deduplication target 216) included within stored content 124.

Accordingly, storage management process 10 may execute 304 a comparison operation with respect to the potential deduplication candidate (e.g., content 106) and the related deduplication target (e.g., deduplication target 216) to generate a comparison result (e.g., comparison result 128).

While the following discussion concerns the comparison operation executed 304 by storage management process 10 being an XOR operation, this is for illustrative purposes only and is not intended to be a limitation of this disclosure, as other configurations are possible and are considered to be within the scope of this disclosure. For example, such a comparison operation may be effectuated by calculating a byte-wise duff using various algorithms (e.g., xdelta and zdelta). The output of these algorithms may be used to reconstruct the candidate in the future relative to the target, and the size of the output may directly be used as a measure of similarity (like counting the number of 0s in an XOR output), This delta representation may be smaller or larger than the compressed XOR representation (depending upon data properties).

When executing 304 a comparison operation with respect to the potential deduplication candidate (e.g., content 106) and the related deduplication target (e.g., deduplication target 216) to generate a comparison result (e.g., comparison result 128), storage management process 10 may execute 306 an XOR operation with respect to the potential deduplication candidate (e.g., content 106) and the related deduplication target (e.g., deduplication target 216) to generate the comparison result (e.g., comparison result 128). For example, storage management process 10 may retrieve deduplication target 216 from storage platform 216 and execute 306 an XOR operation with respect to content 106 and deduplication target 216 to generate comparison result 128. These XOR operations may be executed quite quickly and efficiently due to the parallelism capabilities of modern microprocessors.

As is known in the art, an XOR operation (i.e., an Exclusive OR operation) is a logical operator that results is a true (i.e., a binary 1) when either of the operands are true (i.e., one is true and the other one is false) but results in a false (i.e., a binary 0) when both of the operands are true or both of the operands are false. Accordingly and when using an XOR operation to determine differences between the potential deduplication candidate (e.g., content 106) and the related deduplication target (e.g., deduplication target 216), the level of difference between content 106 and deduplication target 216 may be gauged by determining the number of binary 0s included within comparison result 128.

Accordingly, storage management process 10 may determine 308 a level of similarity between the potential deduplication candidate (e.g., content 106) and the related deduplication target (e.g., deduplication target 216) by processing the comparison result (e.g., comparison result 128). When processing the comparison result (e.g., comparison result 128), storage management process 10 may determine how many binary 0s are in the comparison result (e.g., comparison result 128).

For example, if there are zero binary 1s and all binary 0s within comparison result 128, the potential deduplication candidate (e.g., content 106) and the related deduplication target (e.g., deduplication target 216) are identical. If there are e.g., 1-32 binary 1s within comparison result 128 (and the rest are binary 0s), the potential deduplication candidate (e.g., content 106) and the related deduplication target (e.g., deduplication target 216) may be considered quite similar; while if there are e.g., >32 binary 1s within comparison result 128 (and the rest are binary 0s), the potential deduplication candidate (e.g., content 106) and the related deduplication target (e.g., deduplication target 216) may be considered quite dissimilar If the level of similarity between the potential deduplication candidate (e.g., content 106) and the related deduplication target e.g., deduplication target 216) is sufficiently high (e.g., quite similar), storage management process 10 may store 310 the comparison result (e.g., comparison result 128) to enable subsequent reconstruction of the potential deduplication candidate (e.g., content 106) via the comparison result (e.g., comparison result 128) and the related deduplication target (e.g., deduplication target 216). Accordingly, and in such a situation, the storage of the potential deduplication candidate (e.g., content 106) is not needed as the potential deduplication candidate (e.g., content 106) may be reconstructed from the comparison result (e.g., comparison result 128) that was stored 310 as described above) and deduplication target 216 (which was previously stored).

When storing 310 the comparison result (e.g., comparison result 128) to enable subsequent reconstruction of the potential deduplication candidate (e.g., content 106) via the comparison result (e.g., comparison result 128) and the related deduplication target (e.g., deduplication target 216), storage management process 10 may compress 312 the comparison result (e.g., comparison result 128). For example, and in situations where the level of similarity between the potential deduplication candidate (e.g., content 106) and the related deduplication target (e.g., deduplication target 216) is sufficiently high (e.g., quite similar), comparison result 128 may include a large quantity of binary 0s (for the reasons discussed above). Accordingly, and in such a situation, comparison result 128 may be highly compressible.

If/when the potential deduplication candidate (e.g., content 106) is needed (due to receiving a read request concerning the same), storage management process 10 may reconstruct 314 the potential deduplication candidate (e.g., content 106) by executing an XOR operation with respect to the comparison result (e.g., comparison result 128) and the related deduplication target (e.g., deduplication target 216).

As discussed above, storage management process 10 may compress 312 comparison result 128 prior to storing it within storage platform 102. Accordingly and when reconstructing 314 the potential deduplication candidate (e.g., content 106) by executing an XOR operation with respect to the comparison result (e.g., comparison result 128) and the related deduplication target (e.g., deduplication target 216), storage management process 10 may first need to decompress 316 the comparison result (e.g., comparison result 128) prior to reconstructing 314 the potential deduplication candidate (e.g., content 106).

As will be discussed below in greater detail, storage management process 10 may be configured to utilize an average sector-level entropy to determine the compressibility of a data portion.

As discussed above, content 106 may be a four kilobyte (4,096 byte) block that includes eight 512 byte sectors (e.g., sectors 200, 202, 204, 206, 208, 210, 212, 214). Assume for the following example that storage management process 10 would like to determine the compressibility of content 106.

Figure 5:
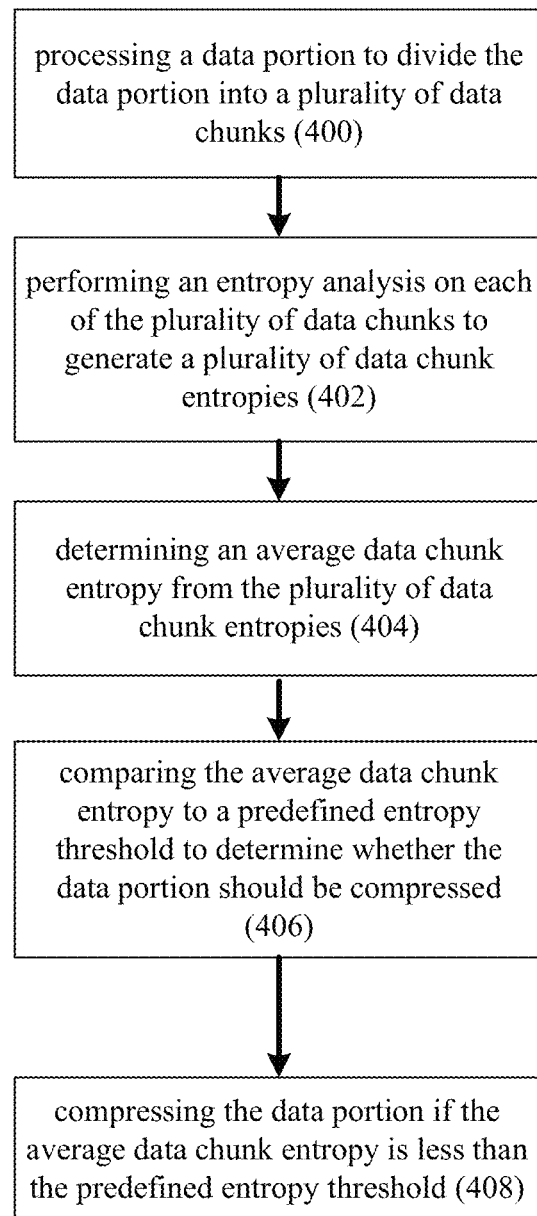
FIG. 5 is a flow chart of another embodiment of the storage management process of FIG. 1.

Referring also to FIG. 5, storage management process 10 may process 400 a data portion (e.g., content 106) to divide the data portion (e.g., content 106) into a plurality of data chunks (e.g., sectors 200, 202, 204, 206, 208, 210, 212, 214). Storage management process 10 may perform 402 an entropy analysis on each of the plurality of data chunks (e.g., sectors 200, 202, 204, 206, 208, 210, 212, 214) to generate a plurality of data chunk entropies (e.g., entropies 130). Storage management process 10 may then determine 404 an average data chunk entropy (e.g., average entropy 132) from the plurality of data chunk entropies (e.g., entropies 130). Mathematically, this average data chunk entropy (e.g., average entropy 132) may be less than or equal to the entropy of the data portion (e.g., content 106). However, and due to the parallelism of modern microprocessors, the plurality of data chunk entropies (e.g., entropies 130) may be calculated more quickly and efficiently than the entropy of the data portion (e.g., content 106).

Entropy may function as a gauge that enables storage management process 10 to determine the compressibility of content 106. Accordingly, and when entropy is higher, the data may be less compressible, as entropy is indicative of randomness (which is not conducive to compression). Conversely, when entropy is lower, the data may be more compressible, as low randomness may be indicative of recurring bit patterns (which are compressible).

The most popular way to measure digital entropy in data is via Shannon's Formula, which generates a result on the scale of 0 (i.e., very low entropy) to 8 (i.e., very high entropy). The Shannon entropy equation may provide a way to estimate the average minimum number of bits needed to encode a string of symbols, based on the frequency of the symbols.

$$H(X) = -\sum_{i=0}^{N-1} p_i \log_2 p_i$$

In the Shannon entropy equation, $p_i$ is the probability of a given symbol. To calculate $\log_2$ from another log base (e.g., $\log_{10}$ or $\log_e$):

$$\log_2(n) = \frac{\log_b(n)}{\log_b(2)}$$

The minimum average number of bits is per symbol:

numBits=$\lceil H(X) \rceil$

So if you have a symbol set {A, B, C, D, E} where the symbol occurrence frequencies are:

$A = 0.5$ $B = 0.2$ $C = 0.1$ $D = 0.1$ $E = 0.1$

The average minimum number of bits needed to represent a symbol is as follows:

$H(X) = [(0.5 \log_2 0.5 + 0.2 \log_2 0.2 + 0.1 \log_2 0.1)*3)]$ $(X) = [-0.5 + (-0.46438) + (-0.9965)]$ $H(X) = -[-1.9]$ $H(X) = 1.9$ Rounding up, we get 2 bits/per symbol. Therefore, representing a ten character string (e.g., AAAAABBCDE) would require 20 bits if the string was encoded optimally. Such an optimal encoding would allocate shorter bit sequences for the frequently occurring symbols (e.g., symbols A, B) and longer bit sequences for the infrequently occurring symbols (e.g., symbols C, D, E).

Storage management process 10 may compare 406 the average data chunk entropy (e.g., average entropy 132) to a predefined entropy threshold to determine whether the data portion (e.g., content 106) should be compressed. As discussed above, storage management process 10 may determine 404 an average data chunk entropy (e.g., average entropy 132) from the plurality of data chunk entropies (e.g., entropies 130), wherein this average data chunk entropy (e.g., average entropy 132) may be in the range of 0-8. For example, it may be desirable to compress the data portion (e.g., content 106) if the average data chunk entropy (e.g., average entropy 132) is less than 2 (on the 0-8 scale). Accordingly, storage management process 10 may compress 408 the data portion (e.g., content 106) if the average data chunk entropy (e.g., average entropy 132) is less than the predefined entropy threshold (e.g., 2 on the 0-8 scale).

As will be discussed below in greater detail, storage management process 10 may be configured to utilize hash entropy of a chunk to determine the compressibility of a data portion.

Figure 6:
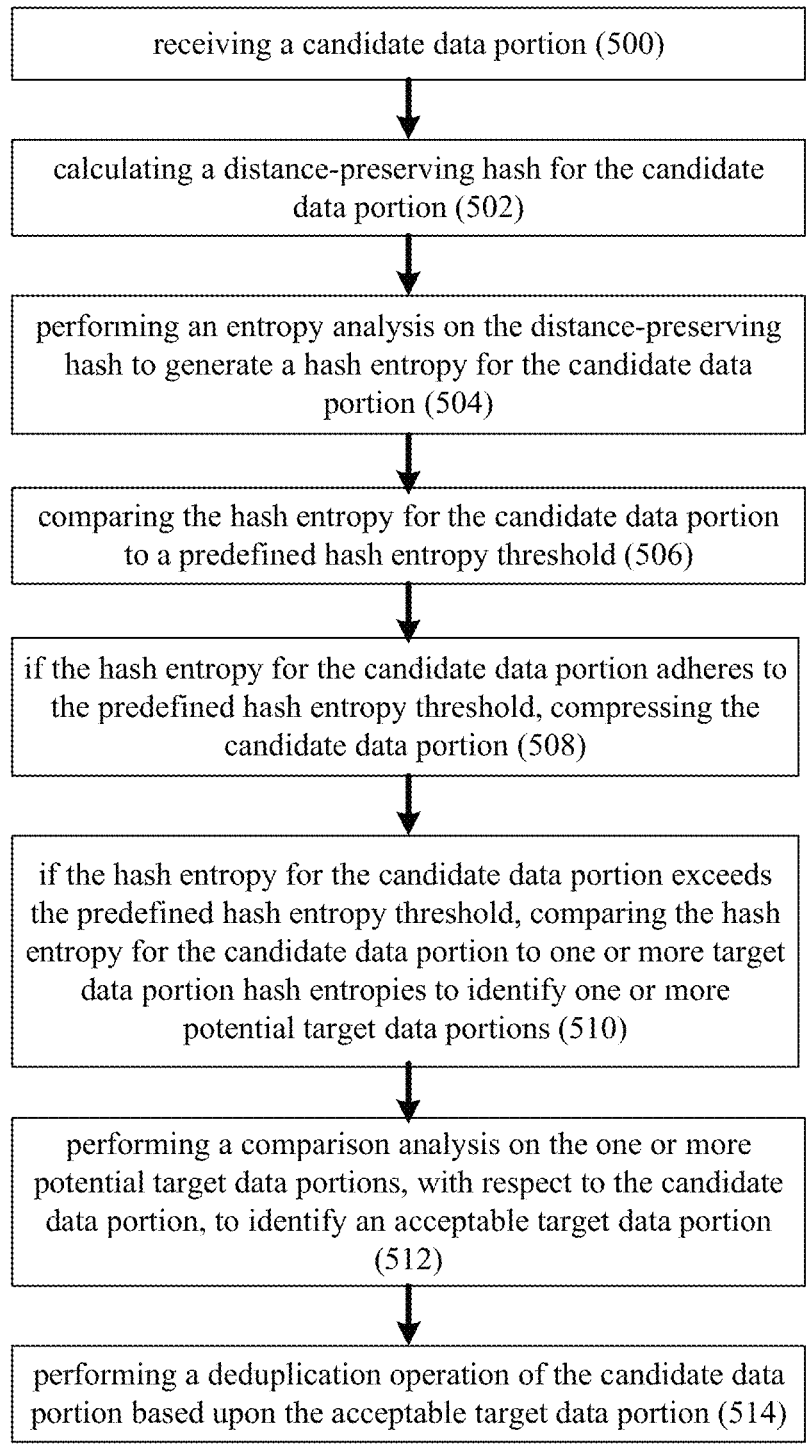
FIG. 6 is a flow chart of another embodiment of the storage management process of FIG. 1.

Referring also to FIG. 6, storage management process 10 may receive 500 a candidate data portion (e.g., content 106) and may calculate 502 a distance-preserving hash (e.g., new hash 122) for the candidate data portion (e.g., content 106). As discussed above, one example of distance-preserving hash (e.g., new hash 122) is a CRC (i.e., cyclic redundancy check), Once calculated 502, storage management process 10 may perform 504 an entropy analysis on the distance-preserving hash (e.g., new hash 122) to generate a hash entropy (e.g., hash entropy 134) for the candidate data portion (e.g., content 106).

As discussed above, entropy may function as a gauge that enables storage management process 10 to determine the compressibility of content 106, wherein: higher entropy is indicative of the data being less compressible and lower entropy is indicative of the data may be more compressible. As further discussed, the most popular way to measure entropy in data is via Shannon's Formula, which generates a result on the scale of 0 (i.e., very low entropy) to 8 (i.e., very high entropy).

Storage management process 10 may compare 506 the hash entropy (e.g., hash entropy 134) for the candidate data portion (e.g., content 106) to a predefined hash entropy threshold. This predefined hash entropy threshold may be configured such that:

a data compression operation will yield a more efficient result than a deduplication operation when the candidate data portion has a hash entropy that adheres to (i.e., is at or below) the hash entropy threshold; and a deduplication operation will yield a more efficient result than a data compression operation when the candidate data portion has a hash entropy above the hash entropy threshold.

If the hash entropy (e.g., hash entropy 134) for the candidate data portion (e.g., content 106) adheres to (i.e., is at or below) the predefined hash entropy threshold, storage management process 10 may compress 508 the candidate data portion (e.g., content 106). For example, if the hash entropy (e.g., hash entropy 134) for the candidate data portion (e.g., content 106) is 2.0 and the predefined hash entropy threshold is 3.0, storage management process 10 may compress 508 the candidate data portion (e.g.; content 106).

However, if the hash entropy (e.g., hash entropy 134) for the candidate data portion (e.g., content 106) exceeds the predefined hash entropy threshold, storage management process 10 may compare 510 the hash entropy (e.g., hash entropy 134) for the candidate data portion (e.g., content 106) to one or more target data portion hash entropies to identify one or more potential target data portions. For example, assume that the hash entropy (e.g., hash entropy 134) for the candidate data portion (e.g., content 106) is 4.0, thus exceeding the predefined hash entropy threshold of 3.0. Accordingly, storage management process 10 may compare 510 the hash entropy (e.g., hash entropy 134) for the candidate data portion (e.g., content 106) to one or more target data portion hash entropies (e.g., target data portion hash entropies 136) to identify one or more potential target data portions.

For example, and as discussed above, when content is being processed by storage system 12, a hash operation may be performed on all of the content received/generated to produce a mathematical representation of the content (e.g., in the form of stored hashes 120) before the content is stored within storage platform 102. Accordingly, storage management process 10 may process stored hashes 120 to generate target data portion hash entropies 136. Once target data portion hash entropies 136 are generated, storage management process 10 may compare hash entropy 134 for the candidate data portion (e.g., content 106) to target data portion hash entropies 136 to identify the one or more potential target data portions.

Specifically, when identifying one or more potential target data portions, storage management process 10 may identify target data portions that have hashes entropies similar to the hash entropy (e.g., hash entropy 134) for the candidate data portion (e.g., content 106). For example, if the hash entropy (e.g., hash entropy 134) for the candidate data portion (e.g., content 106) is 4.0, storage management process 10 may identify one or more target hash entropies (e.g., target hash entropy 138) within target data portion hash entropies 136 that have a similar value (e.g., 3.9-4.1).

Once these similar target hash entropies (e.g., target hash entropies 138) are identified, the potential target data portions may be identified by: associating target hash entropies 138 with specific hashes included within stored hashes 120; and associating these specific hashes included within stored hashes 120 with specific pieces of content (e.g., potential target data portions 140) included within stored content 124.

Upon identifying potential target data portions 140, storage management process 10 may retrieve potential target data portions 140 from storage platform 102. Once retrieved, storage management process 10 may perform 512 a comparison analysis on the potential target data portions 140, with respect to the candidate data portion (e.g., content 106), to identify an acceptable target data portion (e.g., acceptable target data portion 142), For example, storage management process 10 may execute an XOR operation with respect to the candidate data portion (e.g., content 106) and each of potential target data portions 140 to generate comparison result 128, which may identify acceptable target data portion 142. As discussed above, these XOR operations may be executed quite quickly and efficiently due to the parallelism capabilities of modern microprocessors.

Once acceptable target data portion 142 has been identified, storage management process 10 may perform 514 a deduplication operation of the candidate data portion (e.g., content 106) based upon the acceptable target data portion 142. For example, storage management process 10 may store the comparison result (e.g., comparison result 128) to enable subsequent reconstruction of the candidate data portion (e.g., content 106) via the comparison result (e.g., comparison result 128) and acceptable target data portion 142. Accordingly, and in such a situation, the storage of the candidate data portion (e.g., content 106) is not needed, as content 106 may be reconstructed from comparison result 128 and acceptable target data portion 142.

As will be discussed below in greater detail, storage management process 10 may be configured to utilize distance measurements with respect to symbol-based encoding to determine to determine the compressibility of a data portion.

Figure 7:
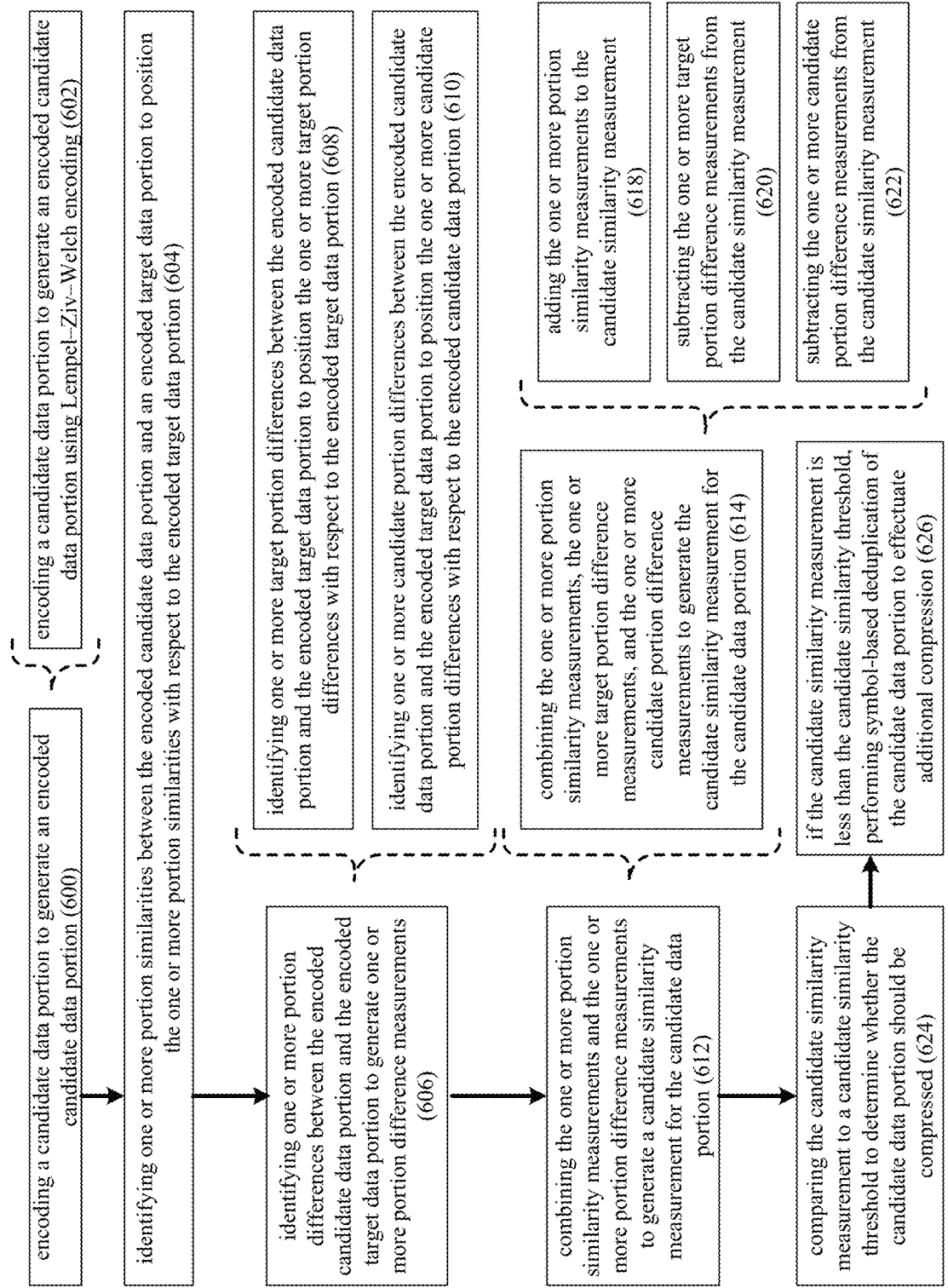
FIG. 7 is a flow chart of another embodiment of the storage management process of FIG. 1.

Referring also to FIG. 7, storage management process 10 may encode 600 a candidate data portion (e.g., content 106) to generate an encoded candidate data portion (e.g., encoded candidate data portion 106'). When encoding 600 a candidate data portion (e.g., content 106) to generate an encoded candidate data portion (e.g., encoded candidate data portion 106'), storage management process 10 may encode 602 the candidate data portion (e.g., content 106) to generate the encoded candidate data portion (e.g., encoded candidate data portion 106') using Lempel-Ziv-Welch encoding.

Lempel-Ziv-Welch (LZW) encoding is a universal lossless data compression algorithm created by Abraham Lempel, Jacob Ziv, and Terry Welch. It was published by Welch in 1984 as an improved implementation of the LZ78 algorithm published by Lempel and Ziv in 1978. The algorithm is simple to implement and has the potential for very high throughput in hardware implementations. It is the algorithm of the widely used Unix file compression utility and is used in the GIF image format.

For the following example, assume that the candidate data portion (e.g., content 106) is the binary string shown below:

| 10100 | 01111 | 00010 | 00101 | 01111 | 10010 | 01110 | 01111 | 10100 | 10100 | 01111 | 00010 |
| 00101 | 01111 | 10010 | 10100 | 01111 | 00010 | 00101 | 01111 | 10010 | 01110 | 01111 | 10100 |

At this point, the candidate data portion (e.g., content 106) as represented by the above-shown binary string is in an unencoded and uncompressed state. The following key may be used to symbol encode the above-shown binary string.

| Symbol | Binary | Decimal |
| --- | --- | --- |
| # | 00000 | 0 |
| A | 00001 | 1 |
| B | 00010 | 2 |
| C | 00011 | 3 |
| D | 00100 | 4 |
| E | 00101 | 5 |
| F | 00110 | 6 |
| G | 00111 | 7 |
| H | 01000 | 8 |
| I | 01001 | 9 |
| J | 01010 | 10 |
| K | 01011 | 11 |
| L | 01100 | 12 |
| M | 01101 | 13 |
| N | 01110 | 14 |
| O | 01111 | 15 |
| P | 10000 | 16 |
| Q | 10001 | 17 |
| R | 10010 | 18 |
| S | 10011 | 19 |
| T | 10100 | 20 |
| U | 10101 | 21 |

-continued

| Symbol | Binary | Decimal |
|---|---|---|
| V | 10110 | 22 |
| W | 10111 | 23 |
| X | 11000 | 24 |
| Y | 11001 | 25 |
| Z | 11010 | 26 |

Storage management process 10 may encode 600 the candidate data portion (e.g., content 106) using the above-shown key to generate the encoded candidate data portion (e.g., encoded candidate data portion 106') shown below:

| T | O | B | E | O | R | N | O | T | T | O | B |
| E | O | R | T | O | B | E | | O | R | N | O | T |

At this point, the encoded candidate data portion (e.g., encoded candidate data portion 106') as represented by the above-shown symbol string is in an encoded but uncompressed state.

Encoded candidate data portion 106' written as a single text string may appear as follows:
TOBEORNOTTOBEORTOBEORNOT
encoded candidate data portion 106' (uncompressed)

Encoded candidate data portion 106' broken into an encoding word string may appear as follows:
TO BE OR NOT TO BE OR TO BE OR NOT
encoded candidate data portion 106' (uncompressed but broken into encoding words)

Storage management process 10 may identify 604 one or more portion similarities between the encoded candidate data portion (e.g., encoded candidate data portion 106') and an encoded target data portion to position the one or more portion similarities with respect to the encoded target data portion, thus generating one or more portion similarity measurements. For this example, assume that storage management process 10 encodes (in the above-described fashion) some or all of stored content 124 to generate encoded content 144. Therefore, storage management process 10 may identify 604 one or more portion similarities between the encoded candidate data portion (e.g., encoded candidate data portion 106') and an encoded target data portion (e.g., encoded content 144) to position the one or more portion similarities with respect to the encoded target data portion (e.g., encoded content 144), thus generating one or more portion similarity measurements.

Further, storage management process 10 may identify 606 one or more portion differences between the encoded candidate data portion (e.g., encoded candidate data portion 106') and the encoded target data portion (e.g., encoded content 144) to generate one or more portion difference measurements.

As discussed above, encoded candidate data portion 106' written as a single text string may appear as follows:
TOBE OR NOTTOBEORTOBEOR NOT
encoded candidate data portion 106' (divided into substrings)

Assume for illustrative purposes that the encoded target data portion encoded content 144) includes a single encoded piece of content as follows:
NOTTOBEORTOBEORTOBEFORTO
encoded content 144

Accordingly and when storage management process 10 identifies 604 one or more portion similarities between the encoded candidate data portion encoded candidate data portion 106') and the encoded target data portion (e.g., encoded content 144) to position the one or more portion similarities with respect to the encoded target data portion encoded content 144), the following procedure may be utilized:
  Locate the first substring "TOBE" within encoded candidate data portion 106'.
  Determine a beginning offset that locates the same substring within encoded content 144: (Answer: 15 . . . the length of NOTTOBEORTOBEOR)
  Locate for next substring "OR" within encoded candidate data portion 106'.
  Determine a beginning offset that locates the same substring within encoded content 144: (Answer: 7 . . . the length of NOTTOBE)
  Locate for next substring "NOTTOBEORTOBEOR" within encoded candidate data portion 106'
  Determine a beginning offset that locates the same substring within encoded content 144: (Answer: 0 . . . as it is at the beginning)

When identifying 606 one or more portion differences between the encoded candidate data portion (e.g., encoded candidate data portion 106') and the encoded target data portion (e.g., encoded content 144) to generate one or more portion difference measurements, storage management process 10 may identify 608 one or more target portion differences between the encoded candidate data portion (e.g., encoded candidate data portion 106') and the encoded target data portion (e.g., encoded content 144) to position the one or more target portion differences with respect to the encoded target data portion (e.g., encoded content 144), thus generating one or more target portion difference measurements.

Further and when storage management process 10 identifies 608 one or more target portion differences between the encoded candidate data portion (e.g., encoded candidate data portion 106') and the encoded target data portion (e.g., encoded content 144), the following procedure may be utilized:
  Identify "F" as a substring that appears exclusively in the encoded target data portion (e.g., encoded content 144).
  Determine an ending offset that locates the same substring within encoded content 144: (Answer: 5 . . . the length of FORTO).

When identifying 606 one or more portion differences between the encoded candidate data portion (e.g., encoded candidate data portion 106') and the encoded target data portion (e.g., encoded content 144) to generate one or more portion difference measurements, storage management process 10 may identify 610 one or more candidate portion differences between the encoded candidate data portion (e.g., encoded candidate data portion 106') and the encoded target data portion (e.g., encoded content 144) to position the one or more candidate portion differences with respect to the encoded candidate data portion (e.g., encoded candidate data portion 106'), thus generating one or more candidate portion difference measurements.

Further and when storage management process 10 identifies 610 one or more candidate portion differences between the encoded candidate data portion (e.g., encoded candidate data portion 106') and the encoded target data portion (e.g., encoded content 144), the following procedure may be utilized:
  Identify "NOT" as a substring that appears exclusively in the encoded candidate data portion (e.g., encoded candidate data portion 106').

Determine an ending offset that locates the same substring within encoded candidate data portion 106': (Answer: 3 . . . the length of NOT)

Storage management process 10 may combine 612 the one or more portion similarity measurements (e.g., 15, 7 & 0) and the one or more portion difference measurements (e.g., 5 & 3) to generate a candidate similarity measurement (e.g., similarity measurement 146) for the candidate data portion (e.g., content 106).

When combining 612 the one or more portion similarity measurements (e.g., 15, 7 & 0) and the one or more portion difference measurements (e.g., 5 & 3) to generate a candidate similarity measurement (e.g., similarity measurement 146) for the candidate data portion (e.g., content 106), storage management process 10 may combine 614 the one or more portion similarity measurements (e.g., 15, 7 & 0), the one or more target portion difference measurements (e.g., 5), and the one or more candidate portion difference measurements (e.g., 3) to generate the candidate similarity measurement (e.g., similarity measurement 146) for the candidate data portion (e.g., content 106).

When combining 614 the one or more portion similarity measurements (e.g., 15, 7 & 0), the one or more target portion difference measurements (e.g., 5), and the one or more candidate portion difference measurements (e.g., 3) to generate the candidate similarity measurement (e.g., similarity measurement 146) for the candidate data portion (e.g., content 106), storage management process 10 may:

- add 616 the one or more portion similarity measurements (e.g., 15, 7 & 0) to the candidate similarity measurement (e.g., similarity measurement 146);
- subtract 618 the one or more target portion difference measurements (e.g., 5) from the candidate similarity measurement (e.g., similarity measurement 146); and
- subtract 620 the one or more candidate portion difference measurements (e.g., 3) from the candidate similarity measurement (e.g., similarity measurement 146).

Accordingly and when storage management process 10 combines 612 the one or more portion similarity measurements (e.g., 15, 7 & 0) and the one or more portion difference measurements (e.g., 5 & 3) to generate a candidate similarity measurement (e.g., similarity measurement 146) for the candidate data portion (e.g., content 106), storage management process 10 may determine that the candidate similarity measurement (e.g.; similarity measurement 146) is 14 (i.e., 15+7+0−5−3).

Storage management process 10 may compare 624 the candidate similarity measurement (e.g., similarity measurement 146) to a candidate similarity threshold to determine whether the candidate data portion (e.g., content 106) should be compressed. if the candidate similarity measurement (e.g., similarity measurement 146) is less than the candidate similarity threshold, storage management process 10 may perform 626 symbol-based deduplication of the encoded candidate data portion (e.g., encoded candidate data portion 106') to effectuate additional compression.

For example, if the candidate similarity threshold is 20 and similarity measurement 146 is 14, storage management process 10 may perform 626 symbol-based deduplication of the encoded candidate data portion (e.g., encoded candidate data portion 106') to effectuate additional compression, resulting in encoded candidate data portion 106' being compressed from:

TOBEORNOTTOBEORTOBEORNOT
encoded candidate data portion 106' (uncompressed)
to:
3TO 3BE 3OR 2NOT
encoded candidate data portion 106' (compressed)

Thus resulting in encoded candidate data portion 106' being reduced from twenty-four characters to thirteen characters.

As will be discussed below in greater detail, storage management process 10 may be configured to utilize entropy analysis to identify sector offsets between deduplication candidates and deduplication targets.

For various reasons, the sectors within blocks may become shifted/misaligned. For example and referring also to FIG. 8, assume that data 700 is a series of four kilobyte (4,096 byte) blocks that each include eight 512 byte sector (e.g., sectors 702, 704, 706, 708, 710, 712, 714, 716). Assume that data 700 represents a portion of an older version of word processing file 718 that was previously stored on storage platform 102. Further assume that data 720 is also a series of four kilobyte (4,096 byte) blocks that each include eight 512 byte sectors (e.g., sectors 722, 724, 726, 728, 730, 732, 734, 736). However, data 720 represents a portion of a newer version of word processing file 718 that is going to be stored on storage platform 102.

Assume that sector 702 (within data 700) and sector 726 (within data 720) represent the same first paragraph of word processing document 718. However, sector 726 (within data 720) is shifted by two sectors (e.g., sectors 722, 724) with respect to sector 702 due to e.g., the insertion of header information 738 (which is represented by sectors 722, 724) into word processing document 718. Accordingly, and when performing deduplication (in the manner described above), it may be beneficial for storage management process 10 to be aware of this offset/shift.

Figure 9:
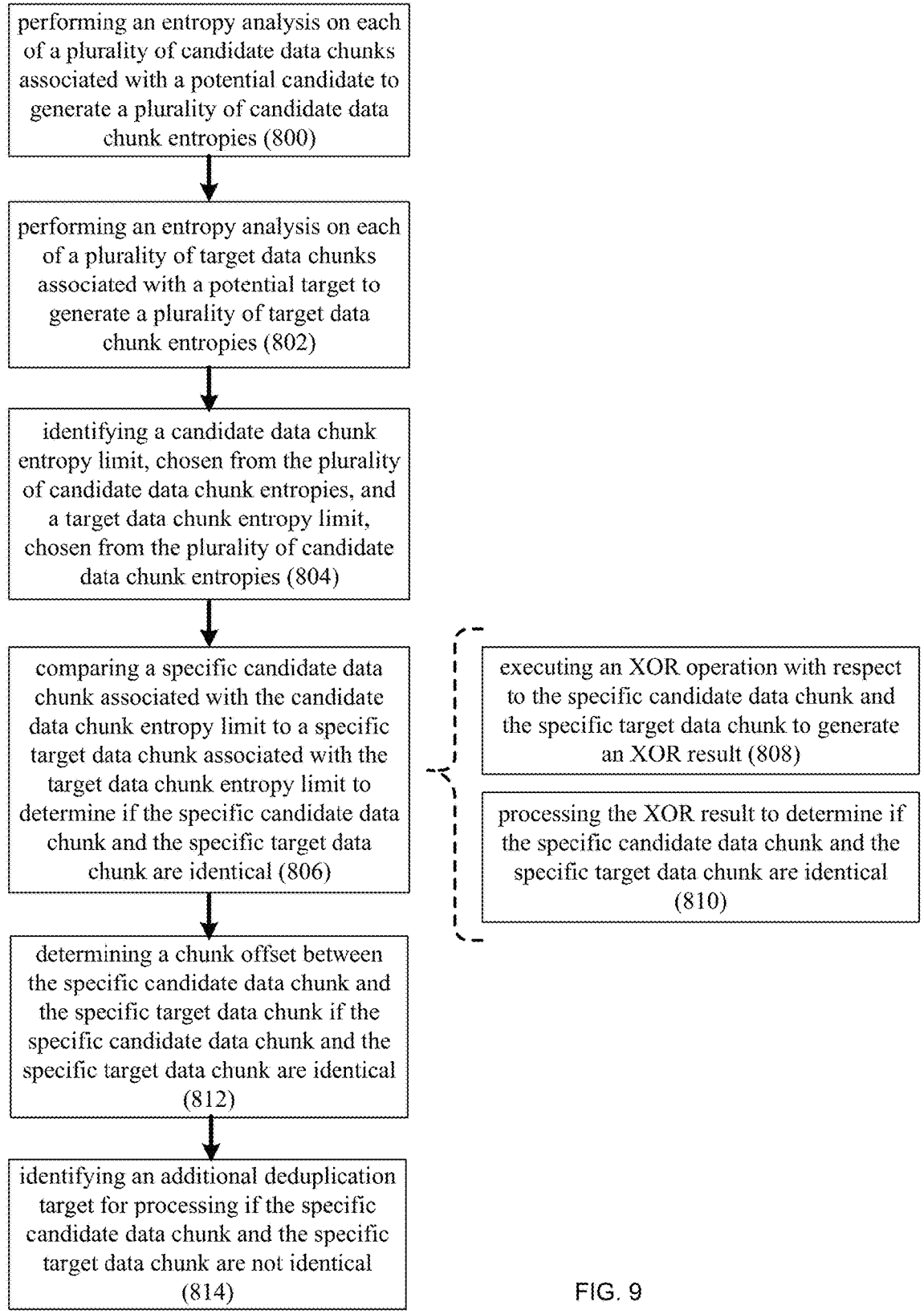
FIG. 9 is a flow chart of another embodiment of the storage management process of FIG. 1.

Accordingly, and referring also to FIG. 9, storage management process 10 may perform 800 an entropy analysis on each of a plurality of candidate data chunks (e.g., sectors 722, 724, 726, 728, 730, 732, 734, 736) associated with a potential candidate (e.g., data 720) to generate a plurality of candidate data chunk entropies (e.g., candidate data chunk entropies 740). Further, storage management process 10 may perform 802 an entropy analysis on each of a plurality of target data chunks (e.g., sectors 702, 704, 706, 708, 710, 712, 714, 716) associated with a potential target (e.g., data 700) to generate a plurality of target data chunk entropies (e.g., target data chunk entropies 742).

As discussed above, the most popular way to measure digital entropy in data is via Shannon's Formula, which generates a result on the scale of 0 (i.e., very low entropy) to 8 (i.e., very high entropy), wherein the Shannon entropy equation may provide a way to estimate the average minimum number of bits needed to encode a string of symbols, based on the frequency of the symbols. Accordingly, the Shannon entropy equation may be utilized to generate candidate data chunk entropies 740 and target data chunk entropies 742.

Once candidate data chunk entropies 740 and target data chunk entropies 742 are generated, storage management process 10 may identify 804 a candidate data chunk entropy limit (e.g., candidate data chunk entropy limit 744), chosen from the plurality of candidate data chunk entropies (e.g., candidate data chunk entropies 740), and a target data chunk entropy limit (e.g., target data chunk entropy limit 746), chosen from the plurality of target data chunk entropies (e.g., target data chunk entropies 742).

Figure 8:
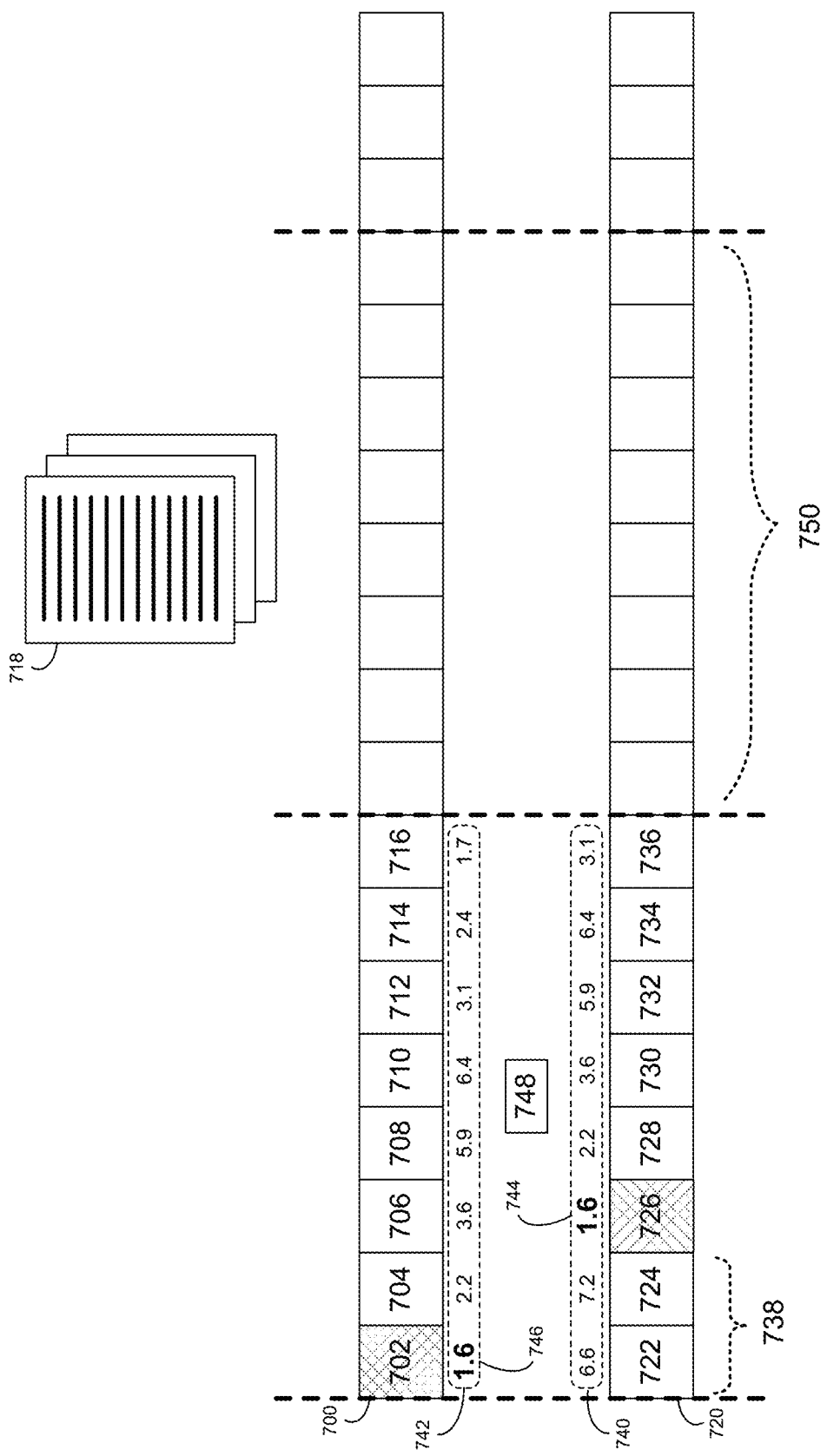
FIG. 8 is a diagrammatic view of various blocks and sectors.

The candidate data chunk entropy limit (e.g., candidate data chunk entropy limit 744) and the target data chunk entropy limit (e.g., target data chunk entropy limit 746) may include one or more of: a candidate data chunk entropy minimum and a target data chunk entropy minimum (as shown in FIG. 8); and a candidate data chunk entropy maximum and a target data chunk entropy maximum.

As sector 702 (within data 700) and sector 726 (within data 720) have similar/identical data chunk entropy limits (both having an entropy of 1.6), sector 702 and sector 726 may be identical. Accordingly, storage management process 10 may compare 806 a specific candidate data chunk (e.g., sector 726) associated with candidate data chunk entropy limit 744 to a specific target data chunk (e.g., sector 702) associated with target data chunk entropy limit 746 to determine if the specific candidate data chunk (e.g., sector 726) and the specific target data chunk (e.g., sector 702) are identical.

When comparing 806 a specific candidate data chunk (e.g., sector 726) associated with candidate data chunk entropy limit 744 to a specific target data chunk (e.g., sector 702) associated with target data chunk entropy limit 746 to determine if the specific candidate data chunk (e.g., sector 726) and the specific target data chunk (e.g., sector 702) are identical, storage management process 10 may:
- execute 808 an XOR operation with respect to the specific candidate data chunk (e.g., sector 726) and the specific target data chunk (e.g., sector 702) to generate an XOR result (e.g., XOR result 748); and
- process 810 the XOR result (e.g., XOR result 748) to determine if the specific candidate data chunk (e.g., sector 726) and the specific target data chunk (e.g., sector 702) are identical.

As is known in the art, an XOR operation (i.e., an Exclusive OR operation) is a logical operator that results is a true (i.e., a binary 1) when either of the operands are true (i.e., one is true and the other one is false) but results in a false (i.e., a binary 0) when both of the operands are true or both of the operands are false. Accordingly, and when using an XOR operation to determine if the specific candidate data chunk (e.g., sector 726) and the specific target data chunk (e.g., sector 702) are identical, the level of difference may be gauged by determining the number of binary 0s included within XOR result 748.

If storage management process 10 determines that the specific candidate data chunk (e.g., sector 726) and the specific target data chunk (e.g., sector 702) are identical, storage management process 10 may determine 812 a chunk offset between the specific candidate data chunk (e.g., sector 726) and the specific target data chunk (e.g., sector 702). For this example, the chunk offset is two sectors (e.g., sectors 722, 724).

If storage management process 10 determines that the specific candidate data chunk (e.g., sector 726) and the specific target data chunk (e.g., sector 702) are not identical, storage management process 10 may identify 814 an additional deduplication target for processing if the specific candidate data chunk (e.g., sector 726) and the specific target data chunk (e.g., sector 702) are not identical. For example, storage management process 10 may perform an entropy analysis on a new group of sectors (e.g., plurality of sectors 750) of data 720.

General:

As will be appreciated by one skilled in the art, the present disclosure may be embodied as a method, a system, or a computer program product. Accordingly, the present disclosure may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, the present disclosure may take the form of a computer program product on a computer-usable storage medium having computer-usable program code embodied in the medium.

Any suitable computer usable or computer readable medium may be utilized. The computer-usable or computer-readable medium may be, for example but not limited to, an electronic, magnetic, optical, electromagnetic, infrared, or semiconductor system, apparatus, device, or propagation medium. More specific examples non-exhaustive list) the computer-readable medium may include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a transmission media such as those supporting the Internet or an intranet, or a magnetic storage device. The computer-usable or computer-readable medium may also be paper or another suitable medium upon which the program is printed, as the program can be electronically captured, via, for instance, optical scanning of the paper or other medium, then compiled, interpreted, or otherwise processed in a suitable manner, if necessary, and then stored in a computer memory. In the context of this document, a computer-usable or computer-readable medium may be any medium that can contain, store, communicate, propagate, or transport the program for use by or in connection with the instruction execution system; apparatus, or device. The computer-usable medium may include a propagated data signal with the computer-usable program code embodied therewith, either in baseband or as part of a carrier wave. The computer usable program code may be transmitted using any appropriate medium, including but not limited to the Internet, wireline, optical fiber cable, RF, etc.

Computer program code for carrying out operations of the present disclosure may be written in an object oriented programming language such as Java, Smalltalk, C++ or the like. However, the computer program code for carrying out operations of the present disclosure may also be written in conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through a local area network/a wide area network/the Internet (e.g., network 14).

The present disclosure is described with reference to flowchart illustrations and/or block diagrams of methods, apparatus (systems) and computer program products according to embodiments of the disclosure. It will be understood that each block of the flowchart illustrations and/or block diagrams, and combinations of blocks in the flowchart illustrations and/or block diagrams, may be implemented by computer program instructions. These computer program instructions may be provided to a processor of a general purpose computer/special purpose computer/other programmable data processing apparatus, such that the instructions, which execute via the processor of the computer or other programmable data processing apparatus, create means for implementing the functions/acts specified in the flowchart and/or block diagram block or blocks.

These computer program instructions may also be stored in a computer-readable memory that may direct a computer or other programmable data processing apparatus to function in a particular manner, such that the instructions stored in the computer-readable memory produce an article of manufacture including instruction means which implement the function/act specified in the flowchart and/or block diagram block or blocks.

The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide steps for implementing the functions/acts specified in the flowchart and/or block diagram block or blocks.

The flowcharts and block diagrams in the figures may illustrate the architecture, functionality, and operation of possible implementations of systems, methods and computer program products according to various embodiments of the present disclosure. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustrations, and combinations of blocks in the block diagrams and/or flowchart illustrations, may be implemented by special purpose hardware-based systems that perform the specified functions or acts, or combinations of special purpose hardware and computer instructions.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

A number of implementations have been described. Having thus described the disclosure of the present application in detail and by reference to embodiments thereof, it will be apparent that modifications and variations are possible without departing from the scope of the disclosure defined in the appended claims.

What is claimed is:

1. A computer-implemented method, executed on a computing device, comprising:
   receiving a candidate data portion;
   calculating a distance-preserving hash for the candidate data portion;
   performing an entropy analysis on the distance-preserving hash to generate a hash entropy for the candidate data portion; and
   comparing the hash entropy for the candidate data portion to a predefined hash entropy threshold, wherein if the hash entropy for the candidate data portion exceeds the predefined hash entropy threshold, comparing the hash entropy for the candidate data portion to one or more target data portion hash entropies to identify one or more potential target data portions and wherein if the hash entropy for the candidate data portion does not exceed the predefined hash entropy threshold, compressing the candidate data portion, wherein the predefined hash entropy threshold is configured such that:
   a data compression operation will yield a more efficient result than a deduplication operation when the candidate data portion has a hash entropy that adheres to the hash entropy threshold; and
   a deduplication operation will yield a more efficient result than a data compression operation when the candidate data portion has a hash entropy above the hash entropy threshold.

2. The computer-implemented method of claim 1 further comprising:
   if the hash entropy for the candidate data portion adheres to the predefined hash entropy threshold, compressing the candidate data portion.

3. The computer-implemented method of claim 1 further comprising:
   performing a comparison analysis on the one or more potential target data portions, with respect to the candidate data portion, to identify an acceptable target data portion.

4. The computer-implemented method of claim 3 further comprising:
   performing a deduplication operation of the candidate data portion based upon the acceptable target data portion.

5. The computer-implemented method of claim 1, wherein the distance-preserving hash includes a cyclic redundancy check.

6. A computer program product residing on a non-transitory computer readable medium having a plurality of instructions stored thereon which, when executed by a processor, cause the processor to perform operations comprising:
   receiving a candidate data portion;
   calculating a distance-preserving hash for the candidate data portion;
   performing an entropy analysis on the distance-preserving hash to generate a hash entropy for the candidate data portion; and comparing the hash entropy for the candidate data portion to a predefined hash entropy threshold, wherein if the hash entropy for the candidate data portion exceeds the predefined hash entropy threshold, comparing the hash entropy for the candidate data portion to one or more target data portion hash entropies to identify one or more potential target data portions, and wherein hash entropies to identify one or more potential target data portions, and wherein if the hash entropy for the candidate data portion does not exceed the predefined has entropy threshold, compressing the candidate data portion, wherein the predefined hash entropy threshold is configured such that:
  a data compression operation will yield a more efficient result than a deduplication operation when the candidate data portion has a hash entropy that adheres to the hash entropy threshold; and
  a deduplication operation will yield a more efficient result than a data compression operation when the candidate data portion has a hash entropy above the hash entropy threshold.

7. The computer program product of claim 6 further comprising:
  if the hash entropy for the candidate data portion adheres to the predefined hash entropy threshold, compressing the candidate data portion.

8. The computer program product of claim 6 further comprising:
  performing a comparison analysis on the one or more potential target data portions, with respect to the candidate data portion, to identify an acceptable target data portion.

9. The computer program product of claim 8 further comprising:
  performing a deduplication operation of the candidate data portion based upon the acceptable target data portion.

10. The computer program product of claim 6, wherein the distance-preserving hash includes a cyclic redundancy check.

11. A computing system including a hardware processor and memory configured to perform operations comprising:
  receiving a candidate data portion;
  calculating a distance-preserving hash for the candidate data portion;
  performing an entropy analysis on the distance-preserving hash to generate a hash entropy for the candidate data portion; and
  comparing the hash entropy for the candidate data portion to a predefined hash entropy threshold, wherein if the hash entropy for the candidate data portion exceeds the predefined hash entropy threshold, comparing the hash entropy for the candidate data portion to one or more target data portion hash entropies to identify one or more potential target data portions, and wherein hash entropies to identify one or more potential target data portions, and wherein if the hash entropy for the candidate data portion does not exceed the predefined has entropy threshold, compressing the candidate data portion, wherein the predefined hash entropy threshold is configured such that:
    a data compression operation will yield a more efficient result than a deduplication operation when the candidate data portion has a hash entropy that adheres to the hash entropy threshold; and
    a deduplication operation will yield a more efficient result than a data compression operation when the candidate data portion has a hash entropy above the hash entropy threshold.

12. The computing system of claim 11 further comprising:
  if the hash entropy for the candidate data portion adheres to the predefined hash entropy threshold, compressing the candidate data portion.

13. The computing system of claim 11 further comprising:
  if the hash entropy for the candidate data portion exceeds the predefined hash entropy threshold, comparing the hash entropy for the candidate data portion to one or more target data portion hash entropies to identify one or more potential target data portions.

14. The computing system of claim 13 further comprising:
  performing a comparison analysis on the one or more potential target data portions, with respect to the candidate data portion, to identify an acceptable target data portion.

15. The computing system of claim 14 further comprising:
  performing a deduplication operation of the candidate data portion based upon the acceptable target data portion.

16. The computing system of claim 11, wherein the distance-preserving hash includes a cyclic redundancy check.

* * * * *